United States Patent [19]

Ibe et al.

[11] Patent Number: 5,007,204
[45] Date of Patent: Apr. 16, 1991

[54] APPARATUS FOR SHAPING INGOTS INTO RIGHT CIRCULAR CYLINDRICAL FORM

[75] Inventors: Hiroyuki Ibe; Takashi Mori, both of Fukui, Japan

[73] Assignee: Shin-Etsu Handotai Company Limited, Tokyo, Japan

[21] Appl. No.: 407,482

[22] Filed: Sep. 14, 1989

[30] Foreign Application Priority Data

Sep. 16, 1988 [JP] Japan .................. 63-230111
Nov. 10, 1988 [JP] Japan .................. 63-282558

[51] Int. Cl.⁵ .............................. B24B 49/00
[52] U.S. Cl. ...................... 51/165.77; 51/289 R; 51/165.71; 51/103 C
[58] Field of Search ........... 51/165.71, 165.74, 165.75, 51/165.77, 165.72, 289 R, 48 R, 49, 103 C

[56] References Cited

U.S. PATENT DOCUMENTS 4,625,461 12/1986 Vetter .................. 51/165.77
4,766,700 8/1988 Kramberg et al. ........... 51/165.74
4,807,400 2/1989 Corallo et al. ............. 51/289 R Primary Examiner—Frederick R. Schmidt
Assistant Examiner—Maurina Rachuba
Attorney, Agent, or Firm—Low, Price, LeBlanc, Becker & Shur

[57] ABSTRACT

An apparatus for smoothing the surface of a monocrystal ingot comprising a center axis finding device, an external cylindrical grinding unit, an ingot setting unit, and an automatic diameter control unit which controls the grinding amount of the external cylindrical grinding unit responsive to the result of the measurement of the local diameter of the monocrystal ingot.

4 Claims, 11 Drawing Sheets

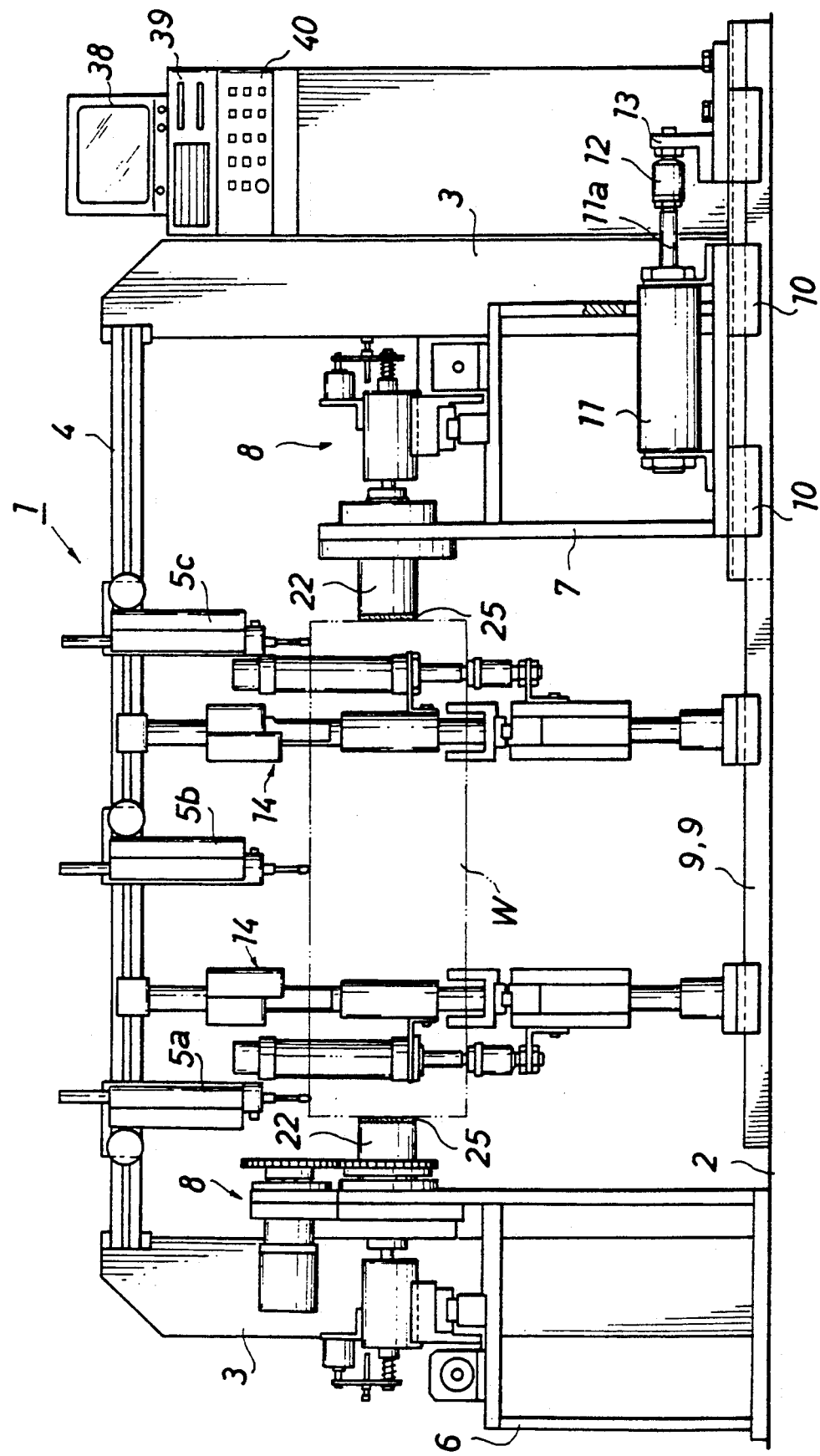

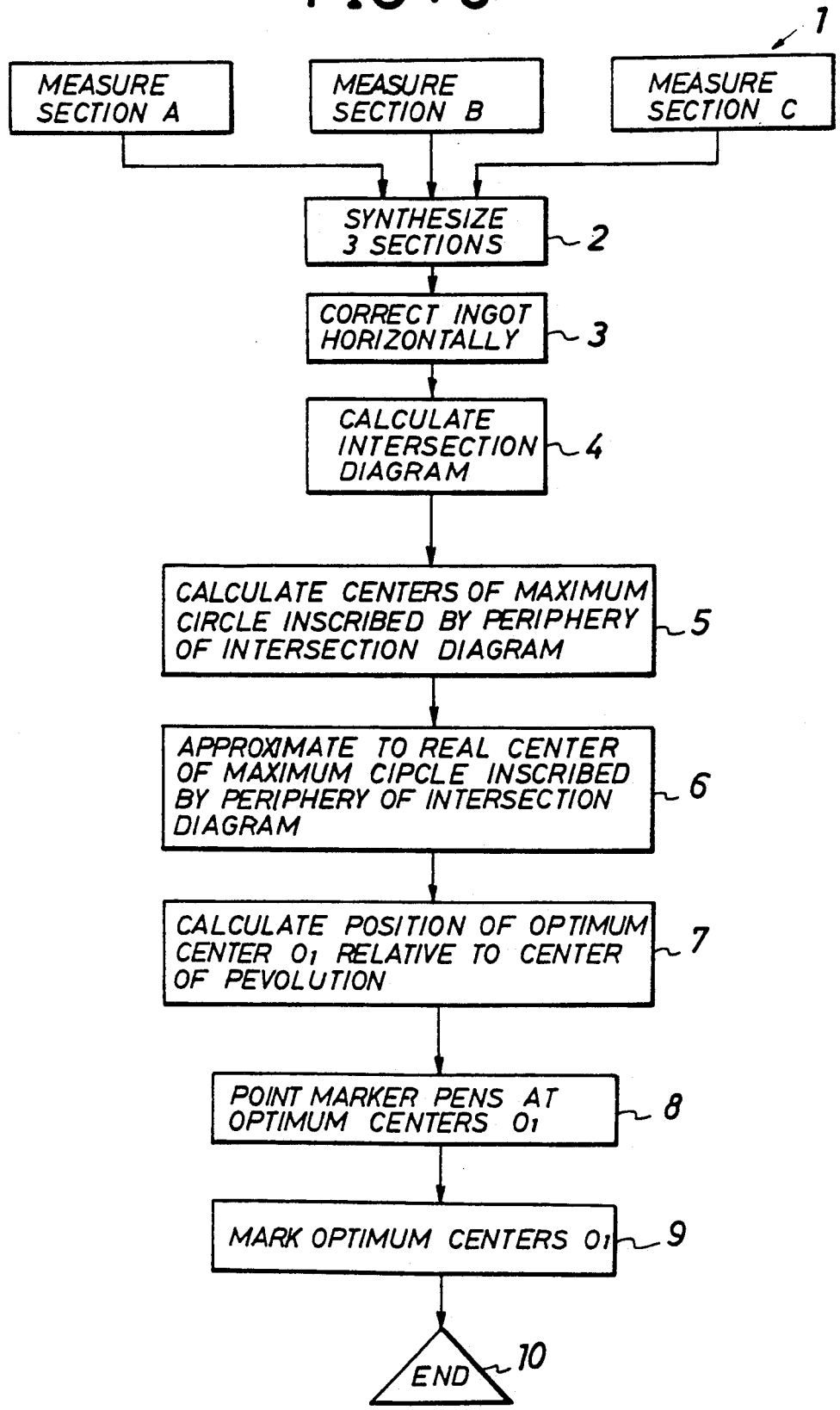

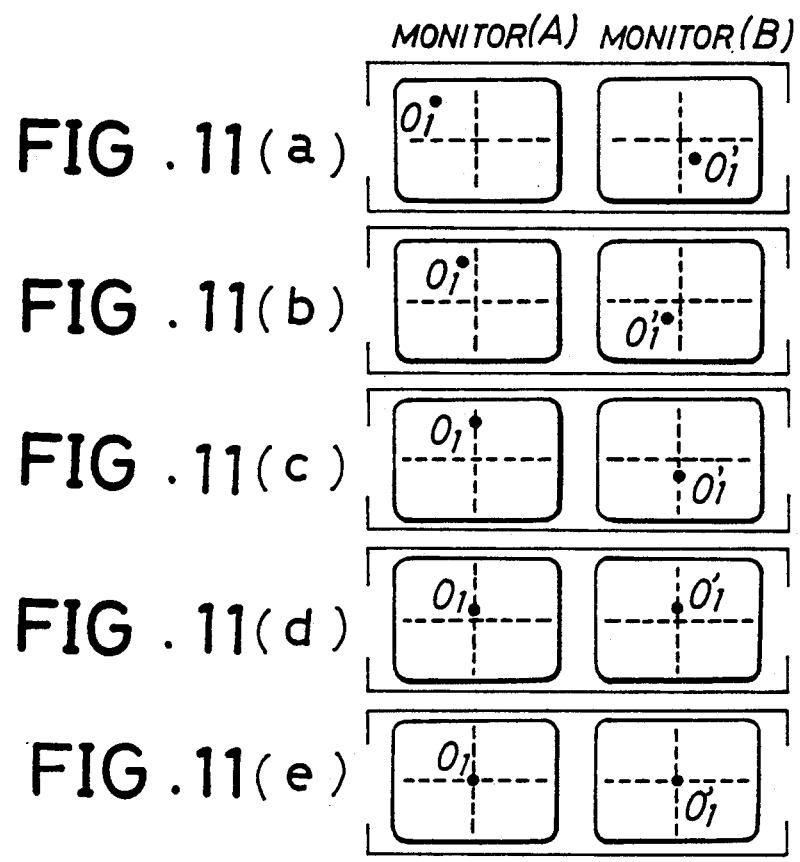
FIG. 11(a)
FIG. 11(b)
FIG. 11(c)
FIG. 11(d)
FIG. 11(e)
FIG. 12
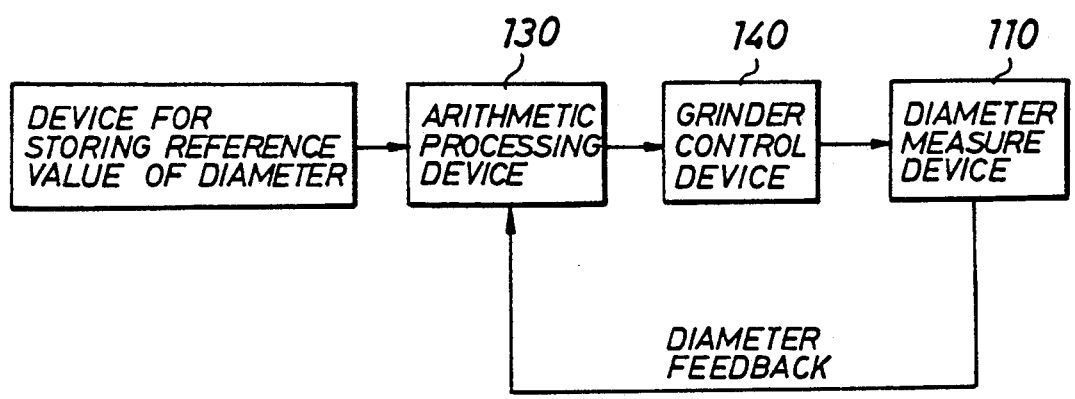

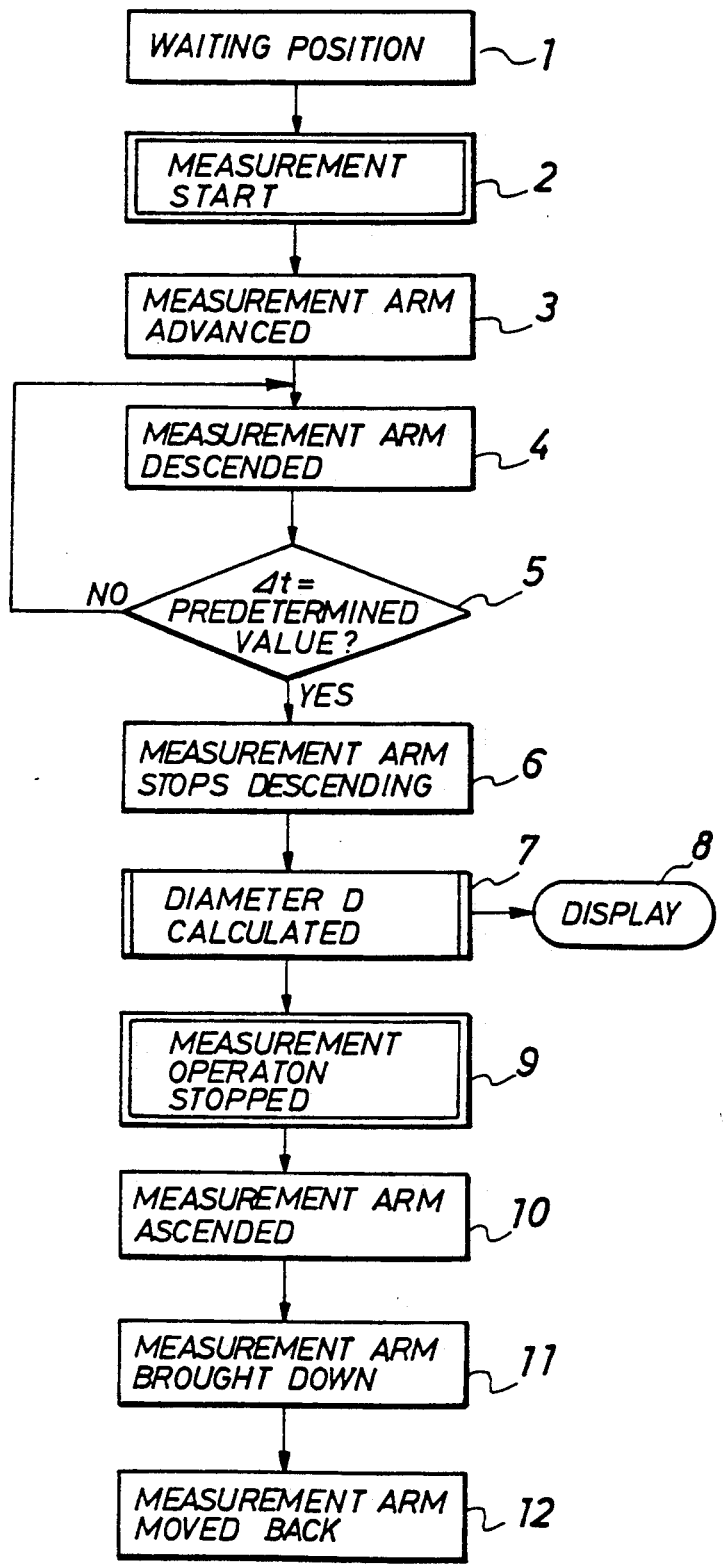

APPARATUS FOR SHAPING INGOTS INTO RIGHT CIRCULAR CYLINDRICAL FORM

BACKGROUND OF THE INVENTION

The present invention relates to an apparatus for shaping monocrystal ingots into right circular cylindrical form with high precision. More particularly, the invention relates to an apparatus which comprises an automatic center axis determining unit, an automatic external cylindrical grinding unit, and an automatic diameter control unit.

A semiconductor monocrystal ingot which is obtained in a crystal pulling method such as the Czochralski method and the floating zone method has a general shape of circular cylinder with cone tail ends. The cone tail ends of the monocrystal ingot are severed from the main body of the monocrystal ingot in order that it can be held firmly at the end furing a subsequent cylindrical grinding process. After the cylindrical grinding, the cylindrical monocrystal ingot is sliced into thin plates called "wafers" in a manner such that the slicing direction is normal to the center line of the ingot. However, a monocrystal ingot has irregular or uneven surfaces such that when it were cut across along a plane including the center line, the cross section would have a waved contours across its length. Therefore, the wafers sliced from the ingot would naturally have varying diameters. This is disadvantageous from the view point of the product quality control. In order to obtain wafers of the same diameter, the ingot must be ground by an external cylindrical grinding machine into the shape of a right circular cylinder, prior to the slicing operation.

To obtain a right circular cylinder with the largest possible diameter from an irregularly contoured cylindrical ingot, it is the primary importance to determine the optimal center axis, based on which the grinding operation is to be conducted. More specifically, the ingot is to be rotated about the optimally determined center axis while it is externally ground. After determining an optimal center axis in an irregularly contoured circular cylinder ingot, two points are marked through which the determined center axis passes, one point in a circular end face of the cylinder and the other point in the other circular end face of the cylinder. To attain the best yield of the right cylindrical ingot, the optimum center axis should be determined such that the uniform diameter of the wafers sliced from the cylindrical monocrystal ingot will be the largest possible. To attain this end, methods were proposed which include Japanese provisional patent publication (kokai) No. 57-66909 (1982), Japanese laid open publication (kokoku) No. 60-17682 (1985), and Japanese laid open publication (kokoku) No. 61-33446 (1986).

According to Japanese provisional patent publication (kokai) No. 57-66909, the center axis of a log is determined by first detecting the contours of at least three cross sections taken normally to the provisional center axis at arbitrarily selected locations including the two end faces; finding the radii and the centers of the maximum inscribed circles in the respective cross sections; then obtaining the maximum right circular cylinder confined by the at least three maximum inscribed circles; and finally finding the center axis of the confined maximum right circular cylinder.

According to Japanese laid open publication (kokoku) No. 60-17682, the center axis of a log is determined in the following manner: a log is rotated about a provisional center axis; light beams are applied to the log normally to the axis thereof from a side position; that light beam which is exactly tangent to the surface of the log is detected every time the log is rotated at intervals of a predetermined angle at a plurality of locations taken along the length of the log; a polygon is obtained from the detected tangent beams at each detection location; the maximum right circular cylinder confined by the polygons is obtained; and the single center line of the confined maximum right circular cylinder is obtained, which is then taken as the center axis about which the log is rotated and externally ground.

According to Japanese laid open publication (kokoku) No. 61-33446, the center axis of a log is determined in a fundamentally similar manner as disclosed by Japanese provisional patent publication (kokai) No. 57-66909 above.

However, the fact is that no equipment has been proposed with which it is possible to effectively practice these methods in obtaining an optimal center axis of a generally cylindrical body. Besides, in the field of semiconductor manufacturing, there has been made no proposal of an apparatus with which it is possible to practice a method for determining the optimum center axis of a monocrystal ingot which is to be ground into a right circular cylinder.

Further, after the optimal center axis is determined in the monocrystal ingot of a generally cylindrical shape, the irregularly waved surface of the ingot is ground in a manner that the ingot will have right circular cross section and straight lengthwise contour, so that a right circular cylinder having a predetermined diameter is obtained, by means of an external cylindrical grinding machine. The thus obtained cylindrical monocrystal ingot is sliced in a direction such that each cut face is approximately normal to the center axis of the ingot, that is, in a crystallographically determined direction. Thereby, thin circular plates are obtained, which are wafers, and lapping and etching operations are applied to the both sides of each wafer. Thereafter, one side of each wafer is polished until specular gloss is obtained.

Conventionally, in the grinding operation of the ingot by means of the external cylindrical grinding machine, the measurement of the diameter, based on which the control of the grind amount is conducted, and the setting of the grind amount were performed in an open-loop control manner, which means that once the grinding amount is set at the onset of grinding it is not modified responsive to the result of grinding. Although a numerical control (NC) system may be employed for setting of the grinder, the measurement of the diameters and others was performed by a man.

In the conventional open-loop control manner, an error in setting the grinder in grind position, the wear of the grinder (e.g., grinding stone), and other factors contribute to a failure in obtaining the aimed diameter with precision. Also, since the setting of the grind amount and the measurement of the ingot diameter are all performed manually by human operators, the precision must depend on the craftsmanship of the operators, which is not promising to obtain constant precision, and a considerable amount of expensive human labor is required.

OBJECTS

It is, therefore, an object of the invention to provide an apparatus which effectively combines an automatic center axis determining unit, an automatic external cylindrical grinding unit, and an automatic diameter control unit, which apparatus is capable of automatically determining the optimal center axis of a monocrystal ingot, setting the ingot in the automatic external cylindrical grinding unit with high precision without the dependence on the mastery of a skilled person, and then grinding the ingot into a right circular cylinder having a predetermined diameter, whereby the human labor is significantly saved and high precision tooling is attained.

SUMMARY OF THE INVENTION

In order to attain the objects of the invention, an apparatus is provided for processing monocrystal ingots into right circular cylindrical form. In particular, according to the invention, there is provided an apparatus comprising:

(i) an automatic center axis determining unit having
a support means for supporting the ingot,
a measure means for dimensionally evaluating the shapes of a plurality of cross sections taken normally to a temporarily presupposed axis of the ingot,
a compute means for computing the location of a center of each of the cross sections based on the dimensional information of the cross sections obtained from said measure means and selecting the optimum center axis from the locations of the thus obtained centers of the cross sections, and
a mark means for marking the points at which the selected center axis passes through the end faces of the ingot;
(ii) an automatic external cylindrical grinding unit;
(iii) an ingot setting unit having
a chuck means for chucking the marked ingot,
a monitor means for monitoring the points marked by the mark means,
an align means for aligning the marked points of the ingot monitored by said monitor means with the spin center line of said external cylindrical grinding unit, and
a convey means for conveying the ingot into the grinding position of said external cylindrical grinding unit; and
(iv) an automatic diameter control unit having
a diameter measure means for measuring the diameter of the ingot without coming in contact with the ingot and in a real-time manner;
an arithmetic process means for comparing the value of the measured diameter received in a feedback manner from the diameter measure means with a predetermined reference value, and for generating a control signal in response to the result of the comparison; and
a grinder control means for controlling the amount of displacement of the grinder in response to the control signal from the arithmetic process means.

According to the invention, the optimum center axis of the ingot to be tooled is analytically determined based on the dimensional data measured of the cross sections of the ingot, and the ingot is set in the external cylindrical grinding unit such that the center axis of the ingot and the spin center line of said external cylindrical grinding unit are aligned to each other, so that it is possible to prepare the ingot and the tooling apparatus in optimum tooling position without resorting to the experienced operator's craftsmanship, and it is therefore possible to carry out a precision tooling operation thereafter.

According to another aspect of the invention, the diameter measure means is employed to measure the diameter of the ingot without coming in contact with the ingot and in a real-time manner, that is, simultaneously with the grinding operation of the ingot, the arithmetic process means is employed to compare the value of the measured diameter received in a feedback manner from the diameter measure means with predetermined reference value, and the grinder control means is employed to control the amount of displacement of the grinder in response to the control signal received from the arithmetic process means representing the required grinding amount determined based on the result of said comparison, so that the control of the amount to be ground by the automatic external cylindrical grinding unit is determined in closed-loop control manner, i.e., in feedback control manner. As a result, errors attributable to mis-locating of the center of the ingot, wear of the grinding stone, etc. are automatically compensated for, simultaneously as the ingot is ground to be a right circular cylinder. Also, due to the automatic controlling of the grinding operation, labor requirement is reduced.

Furthermore, according to the invention, since non-contact system is adopted for the measurement of the diameter of the monocrystal ingot, the measurement result can be free from the effects of spinning of the ingot, and, even when the particular surface of the ingot over which the diameter measurement is conducted during the grinding operation is polluted with processing liquid, ground dust, etc., it is possible to obtain high precision measurement result which is not affected by the presence of the pollutants. It is also noted that due to the nature of the non-contact system, the measurement instruments such as air micrometer do not scar the surface of the ingot.

Incidentally, in order to measure a diameter of an ingot with high precision, an air micrometer is useful. The nozzle tip of the air micrometer is placed over the surface of an ingot and an arm fixedly holding the air micrometer is vertically raised or lowered until the back pressure becomes a reference value. The local diameter of the ingot is precision measured by observing the amount of vertical displacement of the arm. In this kind of measurement the allowable error is ±10 μm.

In an operation of cylindrical grinding of a semiconductor monocrystal ingot, the ingot is usually ground to the extent that the diameter is reduced by 1 to 2 mm. A rough (primary) grinding and a precision (finishing) grinding are practiced; the grinding amount is set to a substantially large value in the former and it is set to a reduced value in the latter. However, in the art of the present application, since the closed-loop control system is adopted, the grinding amount in response to which the grinder is displaced is finely controlled on real-time basis, that is, the grinding amount changes incessantly so as to achieve a high precision cylindrical grinding operation.

In the case where the desired grinding amount is 10 μm or less, it is possible to actually measure the grinding amount by the air micrometer after immobilizing the position of the nozzle of the air micrometer.

It is also noted that, strictly speaking, since the grinding stone wears off as it grinds an ingot from one end to the other, the grind amount determined by a same displacement of the grinding stone reduces as the grinding operation proceeds from one end to the other. Consequently, even if the grinding amount is set properly at each location along the ingot, the ingot after grinding operation may not become as right a cylinder as desired. To avoid this, it is possible to finely control the displacement amount of the grinding stone (or the grinding amount of the grinder) in response to the incessantly measured diameter of the already ground portion of the ingot by having the nozzle of the air micrometer placed in the wake of the grinding stone.

The above and other objects and features of the invention will appear more fully hereinafter from a consideration of the following description taken in connection with the accompanying drawings and the novelty thereof pointed out in the appended claims.

BRIEF DESCRIPTION OF DRAWINGS

FIG. 1 is a front view of an embodiment of an automatic center axis determining unit according to the invention;

FIG. 5 is a process chart showing a procedure of the operation of the automatic center axis determining unit;

FIG. 11 is a diagram showing the displays of a monitor;

FIG. 12 is a block diagram showing a construction of an automatic diameter control unit according to the invention;

FIG. 14 is a process chart showing a procedure for measuring the diameter of the ingot by the diameter measure means.

DETAILED DESCRIPTION

Figure 3:
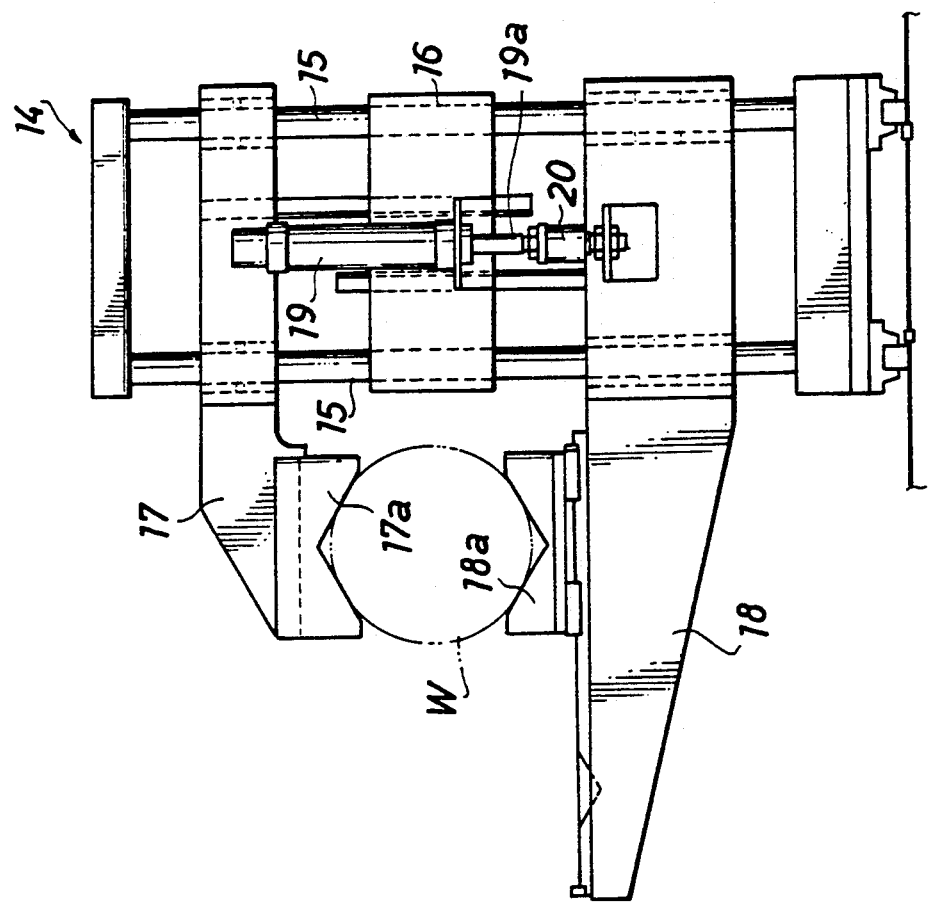
FIG. 3 is a side view of an embodiment of a support means of the invention.
Figure 2:
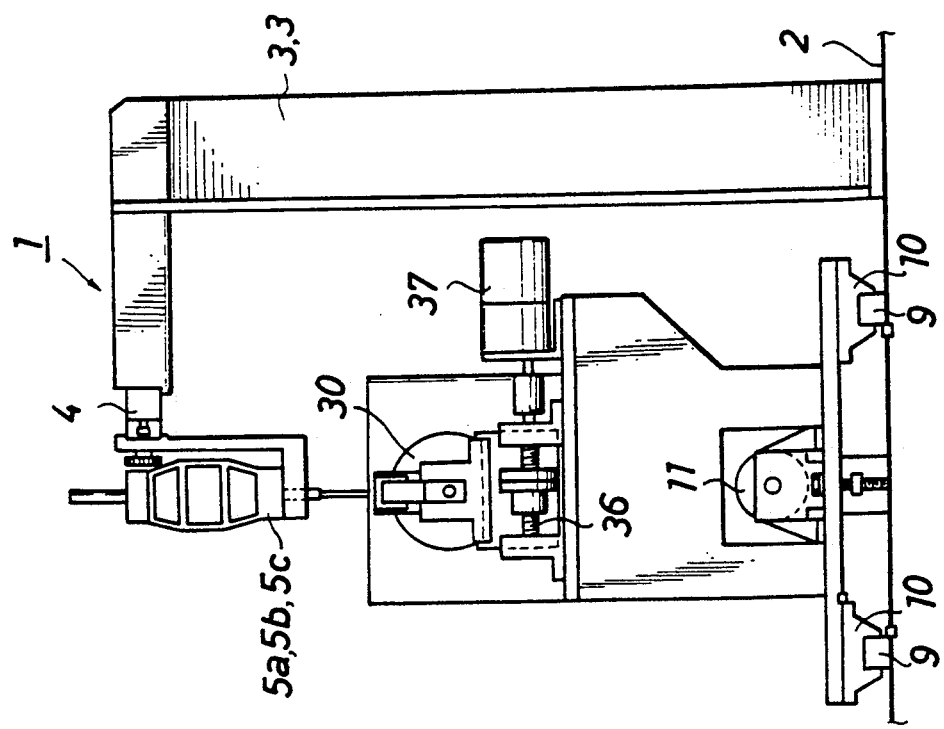
FIG. 2 is a side view of the automatic center axis determining unit of FIG. 1.

First, the construction of an automatic center axis determining unit according to the invention is explained, with reference to FIGS. 1 through 4.

In FIG. 1, which is a front view of the automatic center axis determining unit 1, two struts 3, 3 are fixed standing on a base 2, of which only a part is shown. A support bar 4 is horizontally held by the struts 3, 3. Three indicators 5a, 5b, 5c are provided on the support bar 4 such that the indicators are freely shiftable along the support bar 4. A stationary mount 6 is fixedly provided on the base 2. A pair of parallel rails 9, 9 are fixedly provided on the base 2. A movable mount 7 is equipped with four sliders 10, 10, 10, 10, which are slidably engaged with the rails 9, 9 so that the movable mount 7 is capable of moving along the rails 9, 9 guided thereby. A pair of marker assemblies 8, 8 are mounted on the mounts—one on the stationary mount 6, and the other on the movable mount 7.

An air cylinder 11 is fixed on the base plate of the movable mount 7, and a rod 11a extending from the air cylinder 11 is connected via a joint 12 to a stationary stand 13.

A pair of support assemblies 14, 14 are provided on the rails 9, 9, such that the support assemblies 14, 14 are movable between the stationary mount 6 and the movable mount 7. As shown in FIG. 3, each support assembly 14 comprises a pair of shafts 15, 15, a stationary plate 16 supported by the shafts 15, 15, a stationary holder 17 supported by the shafts 15, 15 at a location above the stationary plate 16, a movable holder 18 slidably supported by the shafts 15, 15 at a location below the stationary plate 16, and an air cylinder 19 fixedly mounted on the stationary plate 16. A rod 19a extending from the air cylinder 19 is connected via a joint 20 to the movable holder 18. A pair of mutually facing claws 17a and 18a are provided on the holders 17, 18, one 17a on the end portion of the stationary holder 17 and the other 18a on the movable holder 18. The claws 17a and 18a have a V-shaped profile.

Figure 4:
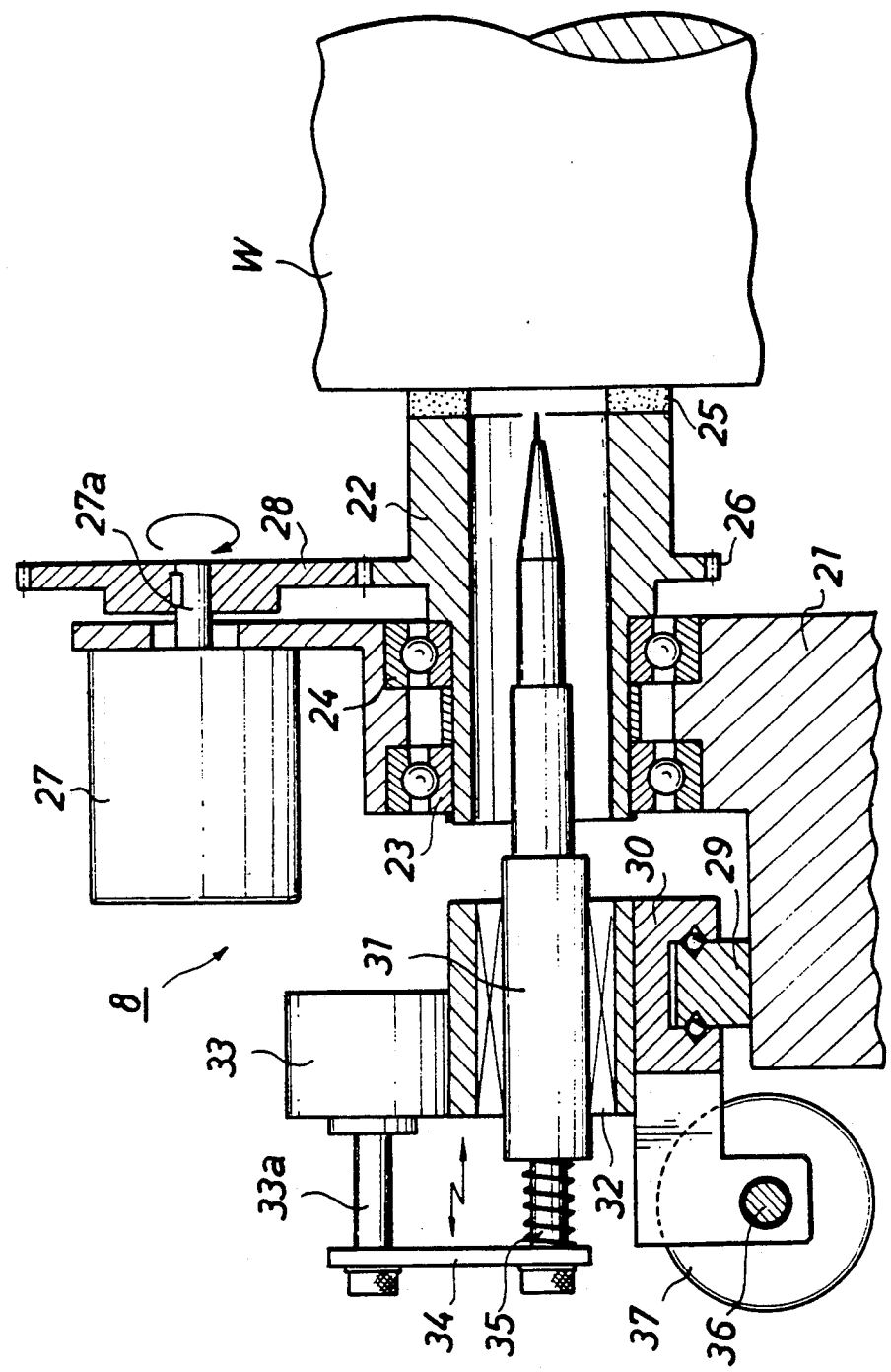
FIG. 4 is an enlarged vertical longitudinal sectional view of an embodiment of a mark means installed in the automatic center axis determining unit of FIG. 1.
Figure 6A:
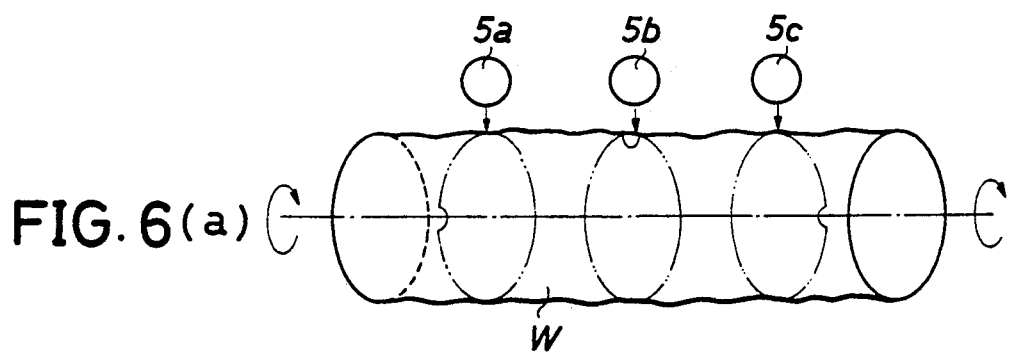
FIG. 6 is an explanatory chart useful as a reference to explain how to determine a center axis.
Figure 6B:
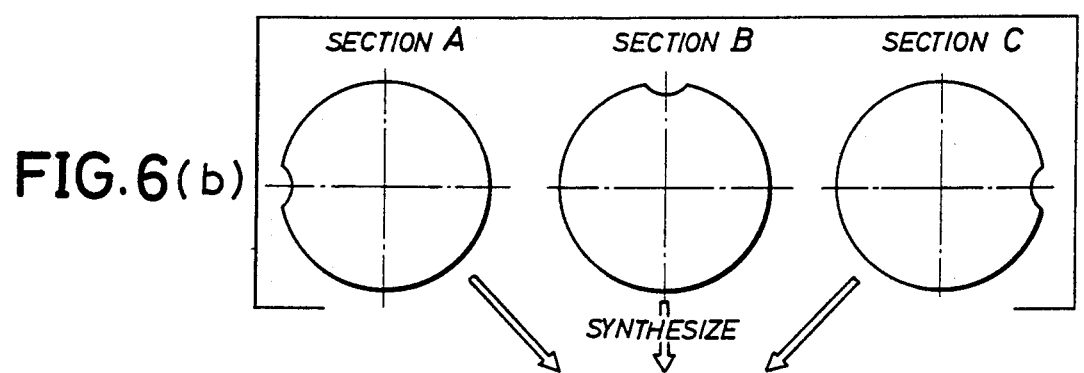
Figure 6C:
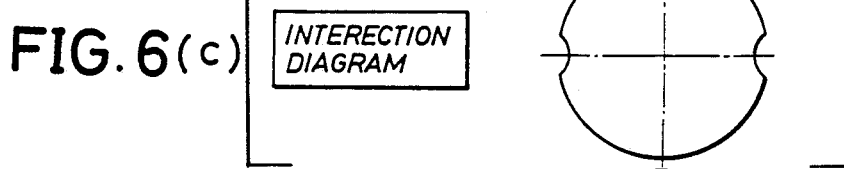
Figure 6D:
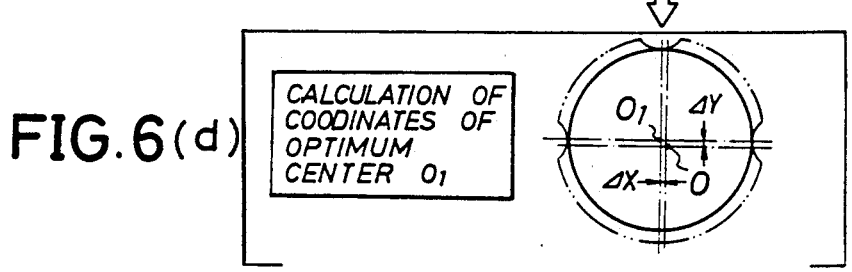

Referring to FIG. 4, the marker assembly 8 provided on the stationary mount 6 will be explained in detail. A cylindrical clamp shaft 22 is received horizontally in a holddown member 21 such that the shaft 22 is freely rotatable therein by virtue of the existence of ball bearing 23 and angular contact ball bearing 24. A ring-shaped friction member 25 is provided at the end of the clamp shaft 22 so as to frictionally hold an ingot W. A gear 26 is integrally provided round the periphery of the clamp shaft 22.

A stepping motor 27 is held horizontally by the holddown member 21 at a location above the cylindrical clamp shaft 22. The output shaft 27a extending from the stepping motor 27 carries a gear 28 locked at shaft end, which 28 meshes with the gear 26. The marker assembly 8 provided on the movable mount 7 lacks the stepping motor 27 and the gears 26 and 28.

A slide guide 29 is laid fixedly on the shoulder of the holddown member 21 such that it extends in the direction normal to the plane of the paper. A holder 30 is slidably engaged with the slide guide 29. The holder 30 carries on it a linear bushing 32, which slidably receives in it a marker pen 31. The end portion of the marker pen 31 is disposed to extend deeply and substantially coaxially in the hollow of the clamp shaft 22. An air cylinder 33 for driving the marker pen 31 is fixed on top of the linear bushing 32, and a rod 33a extending from the air cylinder 33 is connected to the rear end of the marker pen 31 via a connection member 34. A spring 35 for shock absorption is provided around the rear end portion of the marker pen 31.

The holder 30 has a tapped hole through which a substantially long ball screw 36 is threadably passed in the direction normal to the plane of the paper of FIG. 4. The ball screw 36 is rotated by means of a stepping motor 37.

Referring back to FIG. 1, a set consisting of a CRT display 38, a CPU 39, and an operation panel 40 is mounted on the base 2.

Next, the manner in which the automatic center axis determining unit 1 is operated will be explained.

First, an ingot W whose optimal center axis is to be determined is horizontally placed on the movable holders 18, 18 such that the ingot W is snugly received on the claws 18a, 18a. Then, the cylinders 19, 19 are simultaneously operated such that the rods 19a, 19a are withdrawn, whereby the movable holders 18, 18 rise till the ingot W is caught softly between the claws 18a, 18a and the claws 17a, 17a of the holders.

Then the air cylinder 11 is operated such that the rod 11a is pushed out, whereby the movable mount 7 is displaced leftward, as viewed in FIG. 1, along the parallel rails 9, 9. The clamp shaft 22 of the marker assembly 8 on the movable mount 7 thereby urges the ingot W to move leftward until the left end of the ingot W is stopped by the clamp shaft 22 of the marker assembly 8 on the stationary mount 6, whereby the ingot W is caught firmly between the clamp shafts 22, 22 of the marker assemblies 8, 8.

With the ingot W held in this manner, the ingot W is rotated in the claws 17a and 18a, and meanwhile the indicators 5a, 5b, 5c whose styli are disposed to touch the surface of the ingot W take data concerning the dimension of the cross sections whose circumferences are traced by the styli. From the collected data, the center axis based on which the later grinding operation is controlled is determined. With reference to the process chart of FIG. 5 and the explanatory chart of FIG. 6, the procedure of the determination of the center axis will be explained next.

As described above, the ingot W is held horizontally between the clamp shafts 22, 22 such that no axial movement is allowed. As schematically shown in the subchart (a) of FIG. 6, the three indicators 5a, 5b, 5c maintain their styli in contact with the curved surface of the ingot W. Referring to FIG. 4, the stepping motor 27 is operated to drive the output shaft 27a, whereby the torque is transmitted to the clamp shaft 22 by virtue of the gears 28 and 26. As the clamp shaft 22 rotates thereby, the ingot W which is in contact with the clamp shaft 22 via the ring-shaped friction member 25 rotates together with the other clamp shaft 22 on the right in FIG. 1.

Incidentally, in this embodiment, the stepping motor 27 is operated such that the resultant rotation of the ingot W is in the direction indicated by the curved arrows in the subchart (a) of FIG. 6. Also, the stepping motor is kept operated until the ingot W completes one revolution. As the ingot W rotates an entire revolution, the stylus of each of the indicators 5a, 5b, 5c traces the circumference of the respective cross section of the ingot W, acquiring dimensional data therefrom (step 1 in FIG. 5). From the data acquired, cross section diagram A, B, and C are described and displayed on the CRT display 38 (FIG. 1) with the three diagrams superposed on the screen of the CRT display 38.

Then, the three cross section diagrams A, B, C are synthesized together on said screen such that the resultant diagram is the intersection of the diagrams A, B, C (step 2). The subchart (c) of FIG. 6 shows the resultant diagram. However, in synthesizing the diagrams, corrective adjustment is made to the position of the ingot W until the ingot W is held precisely horizontal, which is recognized when the three circular diagrams A, B, C described on the screen of the CRT display 38 substantially coincide with each other. This adjustment is conducted by means of the air cylinder 11 and the air cylinders 19 (step 3). First, the air cylinder 11 is operated to pull in the rod 11a to thereby remove the clamp shaft 22 from the ingot W. Now, the ingot is unfastened. The air cylinders 19 are operated to adjust the ingot W to bring it horizontal.

Thereafter, the intersection diagram [FIG. 6 (c)], which shows an area commonly possessed by the diagrams A, B, and C, is calculated and the data is stored in the CPU 39 (step 4).

In accordance with a known method of obtaining the center of the circle inscribed by the periphery of an intersection diagram, approximate centers of the maximum circle inscribed by the periphery of the intersection diagram [FIG. 6 (c)] are calculated out (step 5), and based on these calculated approximate centers, approximation to the real center is repeated by means of the same method, that is, to obtain the center of the circle inscribed by the periphery of the polygon made by those centers calculated (step 6), and thus the optimum center $O_1$ to be used to determine the center axis of the ingot is eventualy obtained.

When the optimum center $O_1$ is thus obtained, it is compared with the center of revolution O which is actually the point at which the imaginary line connecting the tips of the marker pens 31, 31 passes through the intersection diagrams. In an orthogonal coordinate system with the point O designated as the origin, the coordinates of the point $O_1$, i.e., ($\Delta X$, $\Delta Y$) are calculated [FIG. 6 (d)]. These orthogonal coordinates are converted into the corresponding polar coordinates (r, $\theta$) according to the following conversion equations (step 7):

$$r = \{(\Delta X)^2 + (\Delta Y)^2\}^{\frac{1}{2}}, \theta = \tan^{-1}(\Delta Y/\Delta X).$$

Then, the marker assemblies 8, 8 are shifted so that the tips of the marker pens 31, 31 point at the optimum center $O_1$ with respect to polar coordinates (r, $\theta$) (step 8). The optimum centers $O_1$ are marked by the marker pens 31, 31 in the end faces of the monocrystal ingot W (step 9) whereby the steps for determining the optimum center axis is completed. The steps 8 and 9 are carried out in the following procedure.

The stepping motor 27 is operated to rotate the ingot W through an angle of $\theta$ such that the optimum center $O_1$ now assumes the polar coordinates of (r, 0). Next, the stepping motors 37, 37 are operated to rotate the ball screws 36, 36 till the holders 30, 30 together with the marker pens 31, 31 are displaced in the direction normal to the plane of paper of FIG. 4 by a distance of r whereby the tips of the marker pens 31, 31 coincide with the optimum center $O_1$ of the polar coordinates (r, 0). Now, the air cylinders 33, 33 are operated to take in the rods 33a whereby the marker pens 31, 31 are urged forward and the tips of the marker pens 31, 31 mark the points $O_1$ on the end faces of the monocrystal ingots W representing the points at which the imaginary optimum central axis passes through those faces. By following the steps described above with the apparatus of the invention, it is possible to determine and visually mark the optimum central axis of a monocrystal ingot with high precision without resorting to the craftsmanship of an experienced human operator.

Although in the above embodiment a pair of marker pens 31, 31 are used as the mark means, it is possible to employ a pair of laser markers which emit laser to create a visible mark on an object, and in this case it is possible to eliminate the air cylinder 33, the connection member 34, spring 35 and the linear bushing 32.

Next, referring to FIGS. 7 and 8, an embodiment of the ingot setting unit according to the invention will be described.

Figure 7:
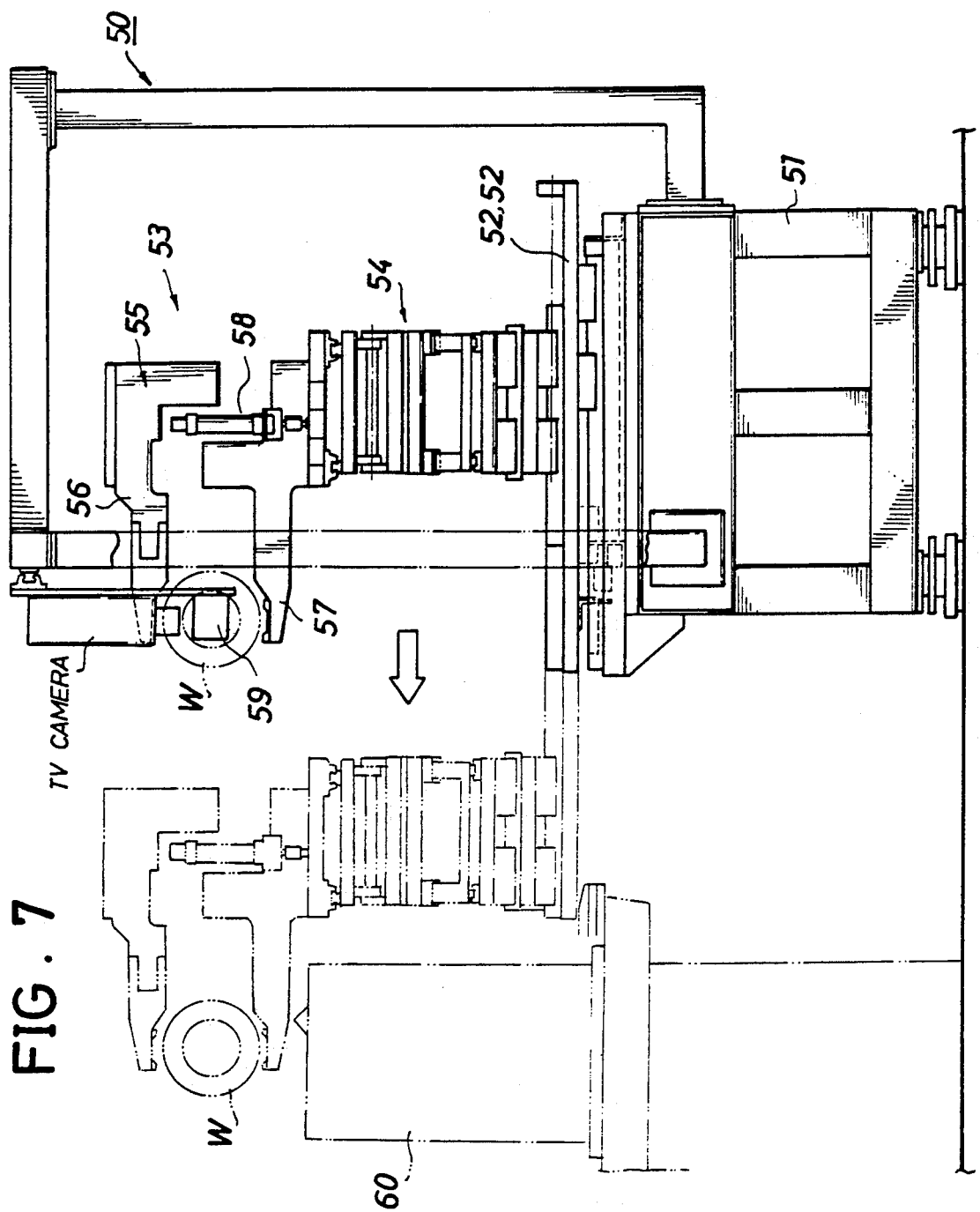
FIG. 7 is a front view of an embodiment of an ingot setting unit of the invention.
Figure 8:
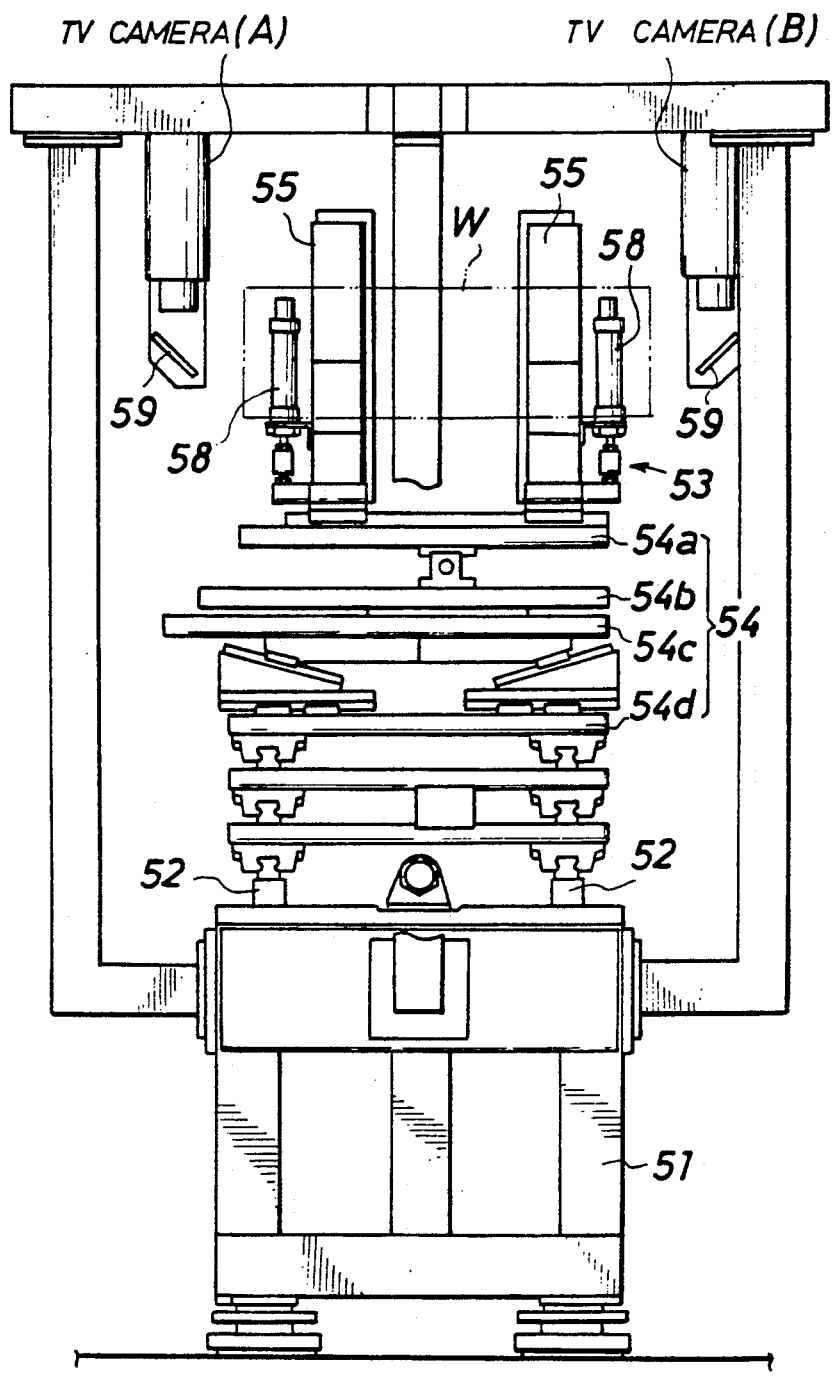
FIG. 8 is a side view of the ingot setting unit of FIG. 7.

FIG. 7 is a front view and FIG. 8 is a side view of an ingot setting unit 50. A pair of parallel guides 52, 52 are laid on a base 51 to extend in the direction normal to the plane of the paper of FIG. 8. An alignment assembly 54 is mounted on the guides 52, 52 such that the assembly 54 is capable of sliding along the guides 52, 52. A chuck assembly 53 is provided on the alignment assembly 54.

The chuck assembly 53 is equipped with a pair of chuck hands 55, 55, and each chuck hand comprises an upper finger 56 and a lower finger 57. While the upper finger 56 is a stationary part, the lower finger 57 is vertically movable driven by an air cylinder 58.

Figure 9:
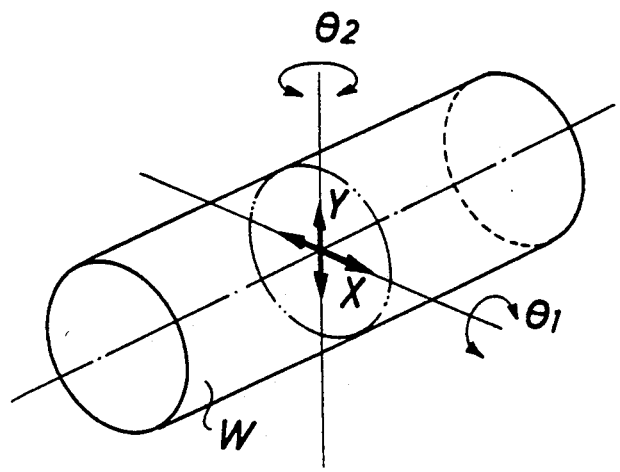
FIG. 9 is a perspective view of an ingot useful as a reference to explain how the ingot is oriented in its alignment.

The alignment assembly 54 essentially consists of adjusters 54a, 54b, 54c, 54d. Referring to FIG. 9, the adjuster 54a is capable of adjusting the orientation of the ingot W in the angular direction $\theta_1$. The adjuster 54b is adapted to adjust the orientation of the ingot W in the angular direction of $\theta_2$. The adjuster 54c is capable of adjusting the orientation of the ingot W by shifting the ingot W in the Y direction. The adjuster 54d adjusts the orientation of the ingot W by shifting the ingot W in the X direction.

Figure 10:
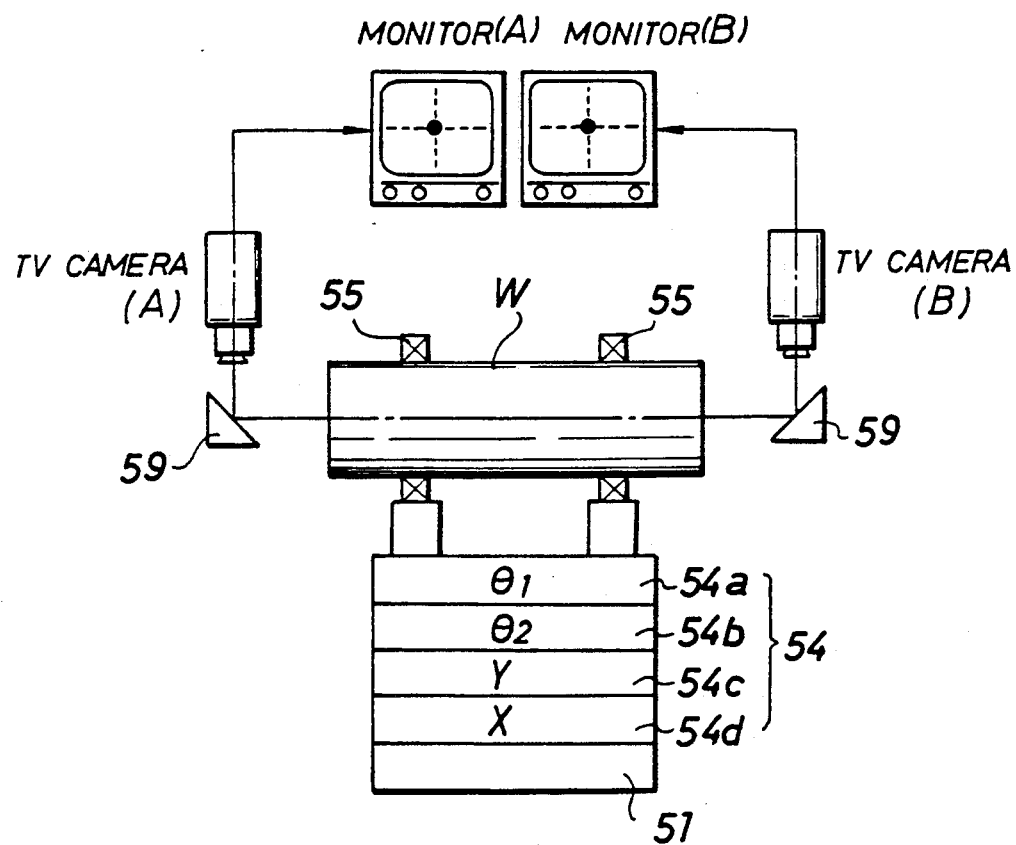
FIG. 10 is a schematic view showing a construction of the ingot setting unit.

The ingot W whose center axis has been determined by the automatic center axis determining unit 1 such that the circular end faces bears marks indicating the position of the center axis is now chucked horizontally by the chuck assembly 53. A pair of reflecting mirrors 59, 59 are provided at a distance from either end face of the ingot W. The mirrors 59, 59 are tilted by 45° from the vertical position such that the visible marks on either end face of the ingot W are reflected by the reflecting mirrors 59, 59 and can be detected by TV cameras (A) and (B). The TV cameras (A) and (B) are electrically connected to monitors (A) and (B) equipped with image receiving tubes (FIG. 10). FIG. 10 schematically shows the construction of the ingot setting unit 50.

While the chuck assembly 53 and the alignment assembly 54 assume the position indicated by the solid lines in FIG. 7, the dot marks ($O_1$, $O_1'$) representing the position of the center axis based on which the later grinding operation should be conducted are reflected by the reflecting mirrors 59, 59 and detected by the TV cameras (A) and (B). The pictures of the dot marks on the end faces of the ingot W are displayed on the monitors (A) and (B).

Let it be supposed that the marked dots ($O_1$, $O_1'$) on the end faces of the ingot W before alignment operation are monitored by the monitors (A) and (B) to be assuming positions indicated in the subchart (a) of FIG. 11. The adjuster 54b of the alignment assembly 54 is operated such that the ingot W is turned slightly about the Y axis as viewed in FIG. 9, that is, in the angular direction of $\theta_2$, whereby the two dots ($O_1$, $O_1'$) on the respective monitors (A) and (B) move at once in opposite directions but in parallel with the horizontal dotted line in FIG. 11 (a). The adjustment by means of the adjuster 54b is continued until the two dots ($O_1$, $O_1'$) assume one and only pair of positions possible where they are both on the same side of and at the same distance from the vertical dotted line on the monitors (A) and (B). As a result, the dots ($O_1$, $O_1'$) newly assume positions as shown in the subchart (b) of FIG. 11. Next, the adjuster 54d of the alignment assembly 54 is operated such that the ingot W is shifted in the direction of X axis as viewed in FIG. 9, whereby the two dots ($O_1$, $O_1'$) on the respective monitors (A) and (B) move in the same direction in parallel with the horizontal dotted line in FIG. 11 (b). The adjustment by means of the adjuster 54d is continued until the two dots ($O_1$, $O_1'$) get coincident on the vertica dotted line on the monitors (A) and (B). As a result, the dots ($O_1$, $O_1'$) newly assume positions as shown in the subchart (c) of FIG. 11. Thereafter, the adjuster 54a of the alignment assembly 54 is operated such that the ingot W is slightly turned about the X axis as viewed in FIG. 9, that is, in the angular direction of $\theta_1$, whereby the two dots ($O_1$, $O_1'$) on the respective monitors (A) and (B) move at once in opposite directions along the vertical dotted line in FIG. 11 (c). The adjustment by means of the adjuster 54a is continued until the two dots ($O_1$, $O_1'$) assume one and only pair of positions possible where they are both on the same side of and at the same distance from the horizontal dotted line on the monitors (A) and (B). As a result, the dots ($O_1$, $O_1'$) newly assume positions as shown in the subchart (d) of FIG. 11. Finally, the adjuster 54c of the alignment assembly 54 is operated such that the ingot W is shifted in the direction of Y axis as viewed in FIG. 9, whereby the two dots ($O_1$, $O_1'$) on the respective monitors (A) and (B) move at once in the same direction along the vertical dotted line in FIG. 11 (d). The adjustment by means of the adjuster 54c is continued until the two dots ($O_1$, $O_1'$) get coincident on the intersection of the vertical and the horizontal dotted lines displayed on the monitors (A) and (B), whereby the alignment as shown in the subchart (e) of FIG. 11 is achieved.

When the alignment of the ingot W as described above is completed, the alignment assembly 54 together with the chuck assembly 53 chucking the ingot W is moved leftward, as viewed in FIG. 7, along the guides 52, 52 until the assemblies 53 and 54 assume the position indicated in two-dot chain lines in FIG. 7 where the ingot W is set to an external cylindrical grinding unit 60 such that the center axis of the ingot W coincides with the spin center line of the external cylindrical grinding unit 60.

The external surface portion of the ingot W is then ground by the external cylindrical grinding unit 60 to have a uniform diameter throughout the whole length of the cylindrical body. Since the center axis of the ingot W is aligned with the spin center line of the external cylindrical grinding unit 60, it is possible to aim at a desired diameter in the later grinding operation. Usually the aimed diameter is set to the diameter of the maximum circle inscribed by the periphery of the intersection diagram [FIG. 6 (c)] obtained at step 6 of FIG. 5. It is therefore possible to predict the maximum constant diameter of the finished ingot W.

Now, referring to FIGS. 12 through 14, an embodiment of the automatic diameter control unit of the invention will be explained.

As shown by the block diagram of FIG. 12, the automatic diameter control unit consists of a diameter measure device 110 for measuring the diameter of the ingot W without coming in contact with the ingot and in a real-time manner; an arithmetic processing device 130 for comparing the value of the measured diameter D input from the diameter measure device 110 with a predetermined reference value $D_0$ and for generating a control signal in response to the result of the comparison; and a grinder control device 140 for controlling the amount of displacement of the grinder 112 in response to the control signal from the arithmetic processing device 130.

Figure 13:
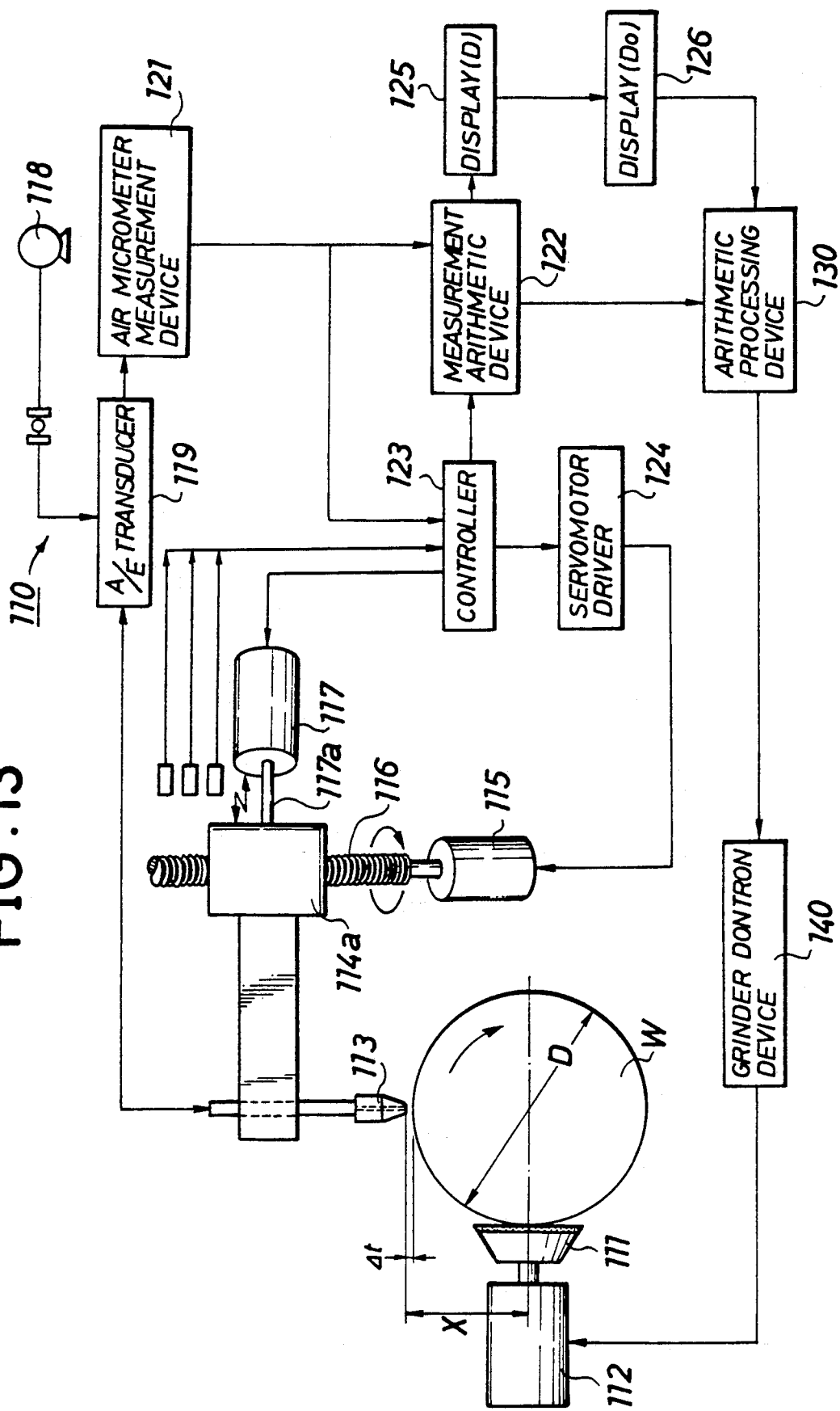
FIG. 13 is a semi block diagram showing a construction of the diameter measure means of the invention.

Referring to FIG. 13, the diameter measure device 110 will be explained in detail. A side view of the monocrystal ingot W having a diameter of D is shown. The ingot W is horizontally chucked by the chuck assembly 53, not shown in FIG. 13, but can be freely rotated in the direction shown by the round arrow in FIG. 13 about its center axis, the center axis being aligned with the spin center line of the external cylindrical grinding unit 60.

The external cylindrical grinding unit 60 includes the grinder 112 with a grinder head 111. The grinder head 111 is driven by the grinder 112 to turn counter-clockwise, as viewed from the ingot W, at a substantially high speed. The front face of the grinder head 111 is covered with a layer of fixed fine abrasive material so that the surface of the ingot W when it comes in contact with the turning grinder head 111 is ground finely.

Set slightly above the ingot W is a nozzle 113 of an air micrometer. In the drawing, the tip of the nozzle 113 is statically positioned in a close approximation to the surface of the ingot W, the variable small distance being designated as $\Delta t$. The nozzle 113 is supported by a horizontally extending measurement arm 114.

The measurement arm 114 is fixed to a base 114a, through which a vertically extending ball screw shaft 116 of an AC servomotor 115 penetrates threadably. Also, the base 114a is rigidly connected to a reciprocative rod 117a of a stationary air cylinder 117, so that when the rod 117a is pushed out or pulled in, the base 114a, the servomotor 115, the measurement arm 114, and the nozzle 113 are displaced all together by the same amount as the rod 117a is shifted. The servomotor 115 is therefore adapted to move in the horizontal direction only and it is vertically immobile.

The air micrometer is adapted to measure the clearance $\Delta t$ between the tip of the nozzle 113 and the immediate surface of the ingot W by blasting pressurized air supplied from a compressed air supply source 118, and detecting the change in the back pressure of the blasted air from a reference value. To detect the change in the back pressure, an A/E (air/electronic) transducer 119 is provided between the compressed air supply source 118 and the nozzle 113. The A/E transducer 119 is electrically connected to a measurement arithmetic device 122 by way of an air micrometer measurement device 121.

In FIG. 13, reference numeral 123 designates a controller for controlling the operations of the air cylinder 117 and the servomotor driver 124 which latter selectively starts the servomotor 115. The selection lies in the direction in which the screw shaft 116 of the servomotor 115 is turned. The controller 123 sends control data to the measurement arithmetic device 122. The measurement arithmetic device 122 calculates out the diameter D of the ingot W based on the control data received from the controller 123 (concerning the distance X between the center axis of the ingot W and the tip of the nozzle 113) and the measurement data received from the air micrometer measurement device 121 (concerning the clearance $\Delta t$). The calculated result is displayed on a display 125, and is compared with the reference value $D_0$ in the arithmetic processing device 130. The result of the comparison is fed back to the grinder control device 140, whereby the grinder control device 140 regulates the displacement amount of the grinder 112 to thereby control the grinding amount of the ingot W such that resulting diameter of the ingot W becomes equal to the aimed diameter (i.e., the reference value $D_0$).

Incidentally, the nozzle 113 of the air micrometer is fixedly set to a position such that the clearance $\Delta t$ between the the tip of the nozzle 113 and the immediate surface of the ingot W is in the range wherein the change in the back pressure detected by the air micrometer is a linear function of the variable clearance $\Delta t$.

In the control procedure of this embodiment, the measured value of the clearance $\Delta t$ is converted into an electric signal by means of the A/E transducer 119. This electric signal is then turned into a digital signal by means of the air micrometer measurement device 121, and when the value represented by this digital signal reaches a predetermined value, the air micrometer measurement device 121 sends a stop command signal to the controller 123 and a signal indicative of the clearance amount $\Delta t$ to the measurement arithmetic device 122. The controller 123, responsive to the stop command signal received from the air micrometer measurement device 121, sends a stop signal to the servomotor driver 124 whereby the AC servomotor 115 is caused to stop and the nozzle 113 is immobilized. On this occasion, the measurement arithmetic device 122 calculates the diameter D of the ingot W from the values of the clearance $\Delta t$ and the distance X between the tip of the nozzle 113 and the center axis of the ingot W. The calculated diameter D is displayed on the display 125. At the same time, the calculated diameter D and the reference value $D_0$ are compared in the arithmetic processing device 130, and the result is fed back to the grinder control device 140.

Next, referring to the process chart of FIG. 14, the procedure of measuring the diameter D of the ingot W by means of the diameter measure device 110 will be explained.

At the onset of the measurement operation, the measurement arm 114 is kept horizontally most withdrawn position, that is, the rod 117a of the stationary air cylinder 117 is in its most drawn-back position, and also vertically the measurement arm 114 is at its origin position. The nozzle 113 is in its waiting position which corresponds to the primary position of the measurement arm 114 described above (step 1 of FIG. 14). When a start switch, not shown, is clicked to the ON position, the display 125 which has been displaying the value of the diameter obtained in the previous measurement operation ceases to display the old value and starts displaying a fresh image to indicate that a new automatic measurement operation is commenced (step 2). The air cylinder 117 is operated to send the measurement arm 114 forward until the arm 114 assumes its most advanced position (step 3). On this occasion, the nozzle 113 assumes a position such that the center line of the nozzle 113 orthogonally crosses the center axis of the ingot W.

Next, the AC servomotor 115 is selectively started by the servomotor driver 124, the selection being such as to rotate the ball screw shaft 116 in a direction to cause the measurement arm 114 to descend (step 4). As the measurement arm 114 descends the clearance between the nozzle tip and the nearest surface of the ingot W diminishes and the back pressure acting on the nozzle 113 increases, and it is detected whether or not the clearance $\Delta t$ has reached a predetermined value (e.g., 0.1 mm), i.e., whether or not the back pressure has reached a predetermined magnitude (step 5). The magnitude of the back pressure acting back on the flow of the compressed air is converted into an electric signal by means of the A/E transducer 119, and this electric signal is then turned into a digital value by means of the air micrometer measurement device 121. This digital value is compared with a reference value representing the predetermined value of the clearance. While the clearance $\Delta t$ is detected to be greater than the predetermined value (that is, the back pressure converted by the A/E transducer 119 is less than the predetermined value), the AC servomotor 115 is kept driving the screw shaft 116 so as to lower the measurement arm 114 furthermore. When it is detected that the clearance $\Delta t$ is equal to the predetermined value, the servomotor driver 124 makes the servomotor 115 stop to thereby immobilize the measurement arm 114 (step 6). With the tip of the nozzle 113 set at the predetermined distance from the nearest surface of the ingot W, the diameter D of the ingot W is calculated based on the measurement data X (step 7). This value X is obtained by finding the amount by which the measurement arm 114 is lowered from the origin position, which is detected by the controller 123. The calculation is conducted in the following manner.

The value representing the distance X (the distance from the center axis of the ingot to the nozzle tip) is supplied to the measurement arithmetic device 122 from the controller 123. The measurement arithmetic device 122 conducts a calculation to obtain the diameter D of the ingot by means of the following equation in which the data of the values $\Delta t$ and X are substituted:

$$D = 2(X - \Delta t)$$

The diameter D of the ingot W obtained from the above equation is displayed on the image of the display 125 (step 8). This result is also fed back to the arithmetic processing device 130, shown in FIG. 12. There, the value of D is compared with the reference value $D_0$ displayed on the image of the display 126 (FIG. 13), and depending on the difference between the two values the grinding amount for grinder head 111 is determined. Then, a control signal representing the grinding amount determined by the arithmetic processing device 130 is supplied to the grinder control device 140, shown in FIG. 12, and the grinder control device 140 causes the grinder 112 to move toward or away from the ingot W by an amount corresponding to the control signal it has received. Consequently, the ingot W is ground by the grinder head 111 to have the predetermined diameter $D_0$.

According to this embodiment of the invention, as described above, the control of the grinding amount of the grinder head 111 is conducted in a so-called closed loop manner, so that it is possible to controllably grind the ingot W whereby the errors attributable to misalignment of the ingot W, wear of the grinder head 111, etc. are automatically compensated for, and therefore it is possible to obtain an ingot W having a shape of right circular cylinder of the predetermined diameter $D_0$ (aimed diameter) with high precision. Since no human-assisted step is involved in the procedure, it is possible to save the human labor.

When the diameter D of the ingot W is calculated out, a stop switch, not shown, is actuated to thereby the measurement operation is halted (step 9), and the AC servomotor is operated such that the measurement arm 14 is caused to ascend until it reaches the highest possible position (step 10). Thereafter, the measurement arm 114 is brought down to the origin position (step 11), and the air cylinder 117 is operated such that the measurement arm 114 is moved backward till it returns to the backmost position (step 12), whereby an operation cycle is completed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus for shaping a monocrystal ingot of roughly circular cylindrical form into exact right circular cylindrical form, comprising:
   (i) an automatic center axis determining unit for determining an optimum center axis of the monocrystal ingot;
   (ii) an automatic external cylindrical grinding unit for controllably grinding the periphery of the ingot;
   (iii) an ingot setting unit for controllably setting the ingot in said external cylindrical grinding unit in such a manner that the optimum center axis of the ingot determined by said center axis determining unit coincide with the spin axis of the external cylindrical grinding unit; and
   (iv) an automatic diameter control unit for measuring a local diameter of the ingot being ground by the external cylindrical grinding unit to determine the depth by which the ingot is to be locally ground from the surface based on the result of the measurement of the local diameter of the ingot.

2. An apparatus for shaping monocrystal ingots of roughly circular cylindrical form into exact right circular cylindrical form comprising:
   (i) an automatic center axis determining unit having
      a support means for supporting the ingot,
      a measure means for dimensionally measuring a plurality of cross sections taken normally to a roughly presupposed axis of the ingot,
      a compute means for computing the location of a center of each of the cross sections based on the dimensional information of the cross sections obtained from said measure means and determining the optimum center axis based on the location of the thus obtained centers of the cross sections, and
      a mark means for visibly marking the points at which the determined optimum center axis passes through the end faces of the ingot;
   (ii) an automatic external cylindrical grinding unit;
   (iii) an ingot setting unit having
      a chuck means for chucking the marked ingot,
      a monitor means for monitoring the points marked by the mark means,
      an align means for aligning the marked points of the ingot monitored by said monitor means with the spin center line of said external cylindrical grinding unit, and
      a convey means for conveying the ingot into the grinding position of said external cylindrical grinding unit; and
   (iv) an automatic diameter control unit having
      a diameter measure means for measuring a local diameter of the ingot without coming in contact with the ingot and in a real-time manner;
      an arithmetic process means for comparing the value of the measured diameter received from the diameter measure means with a predetermined reference value, and for generating a control signal in response to the result of the comparison; and a grinder control means for controlling the grinder to determine its grinding depth in response to the control signal from the arithmetic process means.

3. An apparatus according to claim 2, wherein said mark means comprises two movable marker pens aimed at respective end faces of the ingot, a first drive device to move the marker pens in a direction nomal to the axis of the marker pens, and a second drive device to move the marker pens in the direction of their respective axes.

4. An apparatus according to claim 2, wherein said diameter measure means comprises an air micrometer for measuring the clearance between its nozzle tip and the surface of the ingot, a drive device to controllably move the nozzle of the air micrometer to thereby control the clearance between the nozzle tip of the air micrometer and the surface of the ingot, a computer device for calculating the diameter of the ingot based on the data concerning the clearance between the nozzle tip of the air micrometer and the ingot surface received from the air micrometer and the data concerning the position of the nozzle received from the drive device, and a display device to display the diameter claculated by the computer device.

* * * * *